United States Patent
Sakamoto

(10) Patent No.: US 12,495,666 B2
(45) Date of Patent: Dec. 9, 2025

(54) LIGHT-EMITTING ELEMENT AND DISPLAY DEVICE INCLUDING THE LIGHT-EMITTING ELEMENT

(71) Applicant: Magnolia White Corporation, Tokyo (JP)

(72) Inventor: Asami Sakamoto, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 683 days.

(21) Appl. No.: 17/873,167

(22) Filed: Jul. 26, 2022

(65) Prior Publication Data

US 2023/0032720 A1    Feb. 2, 2023

(30) Foreign Application Priority Data

Jul. 29, 2021 (JP) .................... 2021-124083

(51) Int. Cl.
*H10K 50/16* (2023.01)
*H10K 50/15* (2023.01)

(52) U.S. Cl.
CPC ............ *H10K 50/16* (2023.02); *H10K 50/15* (2023.02)

(58) Field of Classification Search
CPC ........ H10K 50/16; H10K 50/15; H10K 50/12; H10K 59/35; H10K 2101/30
See application file for complete search history.

(56) References Cited

U.S. PATENT DOCUMENTS

| | | | | |
|---|---|---|---|---|
| 8,471,465 B2 * | 6/2013 | Suzuki | ................... | H10K 50/18 313/506 |
| 2003/0044639 A1 | 3/2003 | Fukuda | | |
| 2013/0277656 A1 * | 10/2013 | Seo | ...................... | H10K 50/155 257/40 |

FOREIGN PATENT DOCUMENTS

| JP | 2000-323277 A | 11/2000 |
|---|---|---|
| JP | 2013239703 A | 11/2013 |

OTHER PUBLICATIONS

English machine translation of Japanese Office Action dated Mar. 11, 2025, issued in JP Application No. 2021-124083, 5pp.

* cited by examiner

*Primary Examiner* — Jacob Y Choi
(74) *Attorney, Agent, or Firm* — XSENSUS LLP

(57) ABSTRACT

Disclosed is a light-emitting element including an anode, a first functional layer over the anode, an emission layer over and in contact with the first functional layer, an electron-transporting layer over the emission layer, and a cathode over the electron-transporting layer. The first functional layer includes a first hole-transporting material and a hole-trapping material. The emission layer includes a host material, an emission material, and the hole-trapping material. Concentrations of the hole-trapping material are lower than concentrations of the first hole-transporting material and the host material in the first functional layer and the emission layer, respectively. A highest occupied molecular orbital level of the hole-trapping material is higher than a highest occupied molecular orbital level of the first hole-transporting material and a highest occupied molecular orbital level of the host material.

16 Claims, 10 Drawing Sheets

LIGHT-EMITTING ELEMENT AND DISPLAY DEVICE INCLUDING THE LIGHT-EMITTING ELEMENT

CROSS-REFERENCE TO RELATED APPLICATION

This application claims the benefit of priority to Japanese Patent Application No. 2021-124083, filed on Jul. 29, 2021, the entire contents of which are incorporated herein by reference.

FIELD

An embodiment of the present invention relates to a light-emitting element and a display device including the light-emitting element.

BACKGROUND

As an example of display devices, an organic EL (electroluminescence) display device is represented. An organic EL display device has a plurality of organic light-emitting elements (hereinafter, referred to as a light-emitting element) formed over a substrate, and each light-emitting element includes an electroluminescence layer (hereinafter, referred to as an EL layer) including an organic compound between a pair of electrodes (a cathode and an anode) as a fundamental structure. Holes and electrons are supplied to the EL layer from the anode and the cathode, respectively, by applying a potential difference between the pair of electrodes. The holes and electrons recombine in the EL layer to form an excited state of the organic compound. Emission generated when the excited state radiatively deactivates to a ground state is utilized, thereby realizing a function as a light-emitting element (see Japanese Patent Application Publication No. 2000-323277).

SUMMARY

An embodiment of the present invention is a light-emitting element. The light-emitting element includes an anode, a first functional layer over the anode, an emission layer over and in contact with the first functional layer, an electron-transporting layer over the emission layer, and a cathode over the electron-transporting layer. The first functional layer includes a first hole-transporting material and a hole-trapping material. The emission layer includes a host material, an emission material, and the hole-trapping material. Concentrations of the hole-trapping material are lower than concentrations of the first hole-transporting material and the host material in the first functional layer and the emission layer, respectively. A highest occupied molecular orbital level of the hole-trapping material is higher than a highest occupied molecular orbital level of the first hole-transporting material and a highest occupied molecular orbital level of the host material.

An embodiment of the present invention is a display device. The display device includes a first pixel having a first light-emitting element and a second pixel having a second light-emitting element. The first light-emitting element includes a first anode, a first functional layer over the first anode, a first emission layer over and in contact with the first functional layer, an electron-transporting layer over the first emission layer, and a cathode over the electron-transporting layer. The first functional layer includes a first hole-transporting material and a hole-trapping material. The first emission layer includes a host material, a first emission material, and the hole-trapping material. The second light-emitting element includes a second anode, a hole-transporting layer over the second anode, a second emission layer over the hole-transporting layer, the electron-transporting layer over the second emission layer, and the cathode over the electron-transporting layer. The hole-transporting layer includes the first hole-transporting material. The second emission layer includes a second host material and a second emission material. Concentrations of the hole-trapping material are lower than concentrations of the first hole-transporting material and the first host material in the first functional layer and the first emission layer, respectively. A highest occupied molecular orbital level of the hole-trapping material is lower than a highest occupied molecular orbital level of the first hole-transporting material and a highest occupied molecular orbital level of the host material.

An embodiment of the present invention is a light-emitting element. The light-emitting element includes an anode, a hole-transporting layer over the anode, an emission layer over the hole-transporting layer, a first functional layer over and in contact with the emission layer, and a cathode over the first functional layer. The first functional layer includes a first electron-transporting material and an electron-trapping material. The emission layer includes a host material, an emission material, and the electron-trapping material. Concentrations of the electron-trapping material are lower than concentrations of the first electron-transporting material and the host material in the first functional layer and the emission layer, respectively. A lowest unoccupied molecular orbital level of the electron-trapping material is lower than a lowest unoccupied molecular orbital level of the first electron-transporting material and a lowest unoccupied molecular orbital level of the host material.

An embodiment of the present invention is a display device. The display device includes a first pixel having a first light-emitting element and a second pixel having a second light-emitting element. The first light-emitting element includes a first anode, a hole-transporting layer over the first anode, a first emission layer over the hole-transporting layer, a first functional layer over and in contact with the first emission layer, and a cathode over the first functional layer. The first functional layer includes a first electron-transporting material and an electron-trapping material. The first emission layer includes a first host material, a first emission material, and the electron-trapping material. The second light-emitting element includes a second anode, the hole-transporting layer over the second anode, a second emission layer over the hole-transporting layer, an electron-transporting layer over the second emission layer, and the cathode over the electron-transporting layer. The second emission layer includes a second host material and a second emission material. The electron-transporting layer includes the first electron-transporting material. Concentrations of the electron-trapping material are lower than concentrations of the first electron-transporting material and the first host material in the first functional layer and the first emission layer, respectively. A lowest unoccupied molecular orbital level of the electron-trapping material is lower than a lowest unoccupied molecular orbital level of the first electron-transporting material and a lowest unoccupied molecular orbital level of the first host material.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

When a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, the expression "a structure is exposed from another structure" means a mode in which a part of the structure is not covered by the other structure and includes a mode where the part uncovered by the other structure is further covered by another structure.

First Embodiment

In the present embodiment, a light-emitting element 100, which is an embodiment of the present invention, is explained.

1. Structure of Light-Emitting Element

Figure 1A:
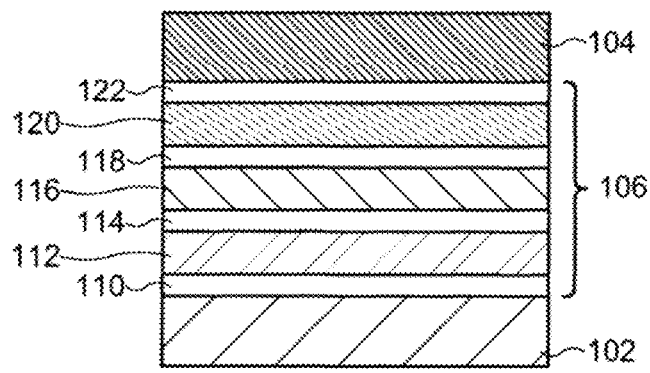
FIG. 1A to 1C are each a schematic cross-sectional view of a light-emitting element according to an embodiment of the present invention.

A schematic cross-sectional view of the light-emitting element 100 according to the present embodiment is shown in FIG. 1A. The light-emitting element 100 is fabricated over a substrate which is not illustrated and includes an emission layer 116 and a pair of electrodes (anode 102 ad cathode 104) sandwiching the emission layer 116. The light-emitting element 100 further includes one or more functional layers between the emission layer 116 and the anode 102 and between the emission layer 116 and the cathode 104. Hereinafter, all of the layers disposed between the anode 102 and the cathode 104 are collectively referred to as an EL layer 106. In the light-emitting element 100, holes and electrons are injected to the EL layer 106 from the anode 102 and the cathode 104, respectively, by providing a potential difference equal to or higher than an emission threshold voltage between the anode 102 and the cathode 104. These carriers recombine in the emission layer 116, allowing an emission material included in the emission layer 116 to exist in an excited state, and the energy generated when the excited state returns to a ground state is utilized as light emission. Note that although the light-emitting element 100 may have a stacked structure having a sequence of the anode 102, the EL layer 106, and the cathode 104 from the substrate as shown in FIG. 1A, it may also have a stacked structure with a reversed sequence.

As the functional layer disposed between the emission layer 116 and the anode 102, a hole-injection layer 110 over and in contact with the anode 102, a hole-transporting layer 112 over and in contact with the hole-injection layer 110, an electron-blocking layer 114 over the hole-transporting layer 112 and in contact with the hole-transporting layer 112 and the emission layer 116, and the like are represented, for example. As the functional layer disposed between the emission layer 116 and the cathode 104, a hole-blocking layer 118 over and in contact with the emission layer 116, an electron-transporting layer 120 over and in contact with the hole-blocking layer 118, an electron-injection layer 112 over the electron-transporting layer 120 and in contact with the electron-transporting layer 120 and the cathode 104, and the like are represented, for example.

Figure 1B:
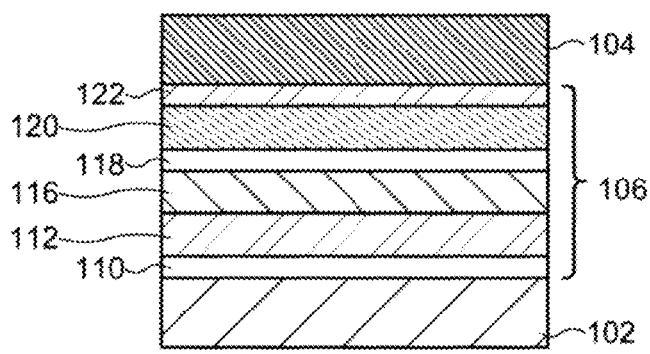
Figure 1C:
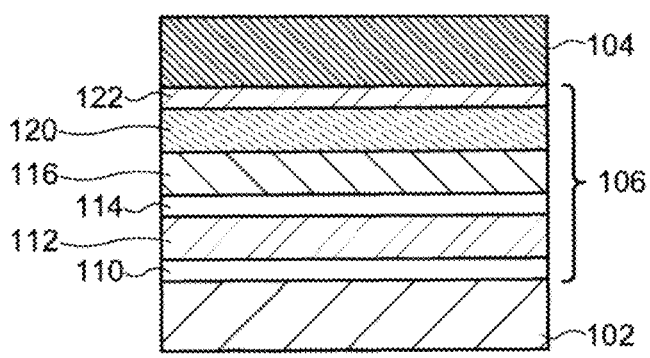

It is not necessary for the light-emitting element 100 to include all of the aforementioned functional layers, and the light-emitting element 100 may be configured so that the hole-transporting layer 112 and the emission layer 116 are in contact with each other without forming the electron-blocking layer 114 as shown in FIG. 1B, for example. Alternatively, the light-emitting element 100 may be configured so that the electron-transporting layer 120 and the emission layer 116 are in contact with each other without forming the hole-blocking layer 118 as shown in FIG. 1C. Although not illustrated, it is not necessary to provide the electron-blocking layer 114 nor the hole-blocking layer 118 or provide the hole-injection layer 110 or the electron-injection layer 112.

The emission layer 116 and the functional layers may each have a single-layer structure or a stacked-layer structure in which a plurality of layers composed of different materials is stacked.

Hereinafter, each component is explained. Note that each of the functional layers as well as the emission layer 116 may be fabricated by co-evaporating plural kinds of materials, and the material having a higher concentration (volume fraction) is referred to as a main component, while the material having a lower concentration (volume fraction) than the main component is referred to as an additional component in this case. The additional component is uniformly dispersed in the main component.

1-1. Anode

The anode 102 is provided in order to inject holes into the EL layers 106, and it is preferred that a surface thereof have a relatively high work function. As a specific material, a conductive oxide capable of transmitting visible light such as indium-tin oxide (ITO) and indium-zinc oxide (IZO) is represented, and silicon may be further included in these materials. With this structure, the emission obtained from the emission layer 116 can be extracted through the anode 102. On the other hand, when the emission obtained from the emission layer 116 is extracted through the cathode 104, the anode 102 may further include a film containing a metal with a high reflectance with respect to visible light such as silver and aluminum. For instance, the anode 102 may have a structure in which a first conductive film containing a conductive oxide, a second conductive film containing a metal such as silver and aluminum, and a third film containing a conductive oxide are stacked in this order.

1-2. Hole-Injection Layer

A compound to which holes can be readily injected from the anode 102, that is, a compound which is readily oxidized (electron-donating compound) can be used as a hole-injection material for the hole-injection layer 110. In other words, a compound (i.e., hole-transporting material) with a high (shallow) highest occupied molecular orbital (HOMO) level and a hole-transporting property higher than an electron-transporting property can be used. For example, a phthalocyanine derivative such as phthalocyanine, copper phthalocyanine, and vanadyl phthalocyanine, a benzidine derivative such as 4,4'-bis[N-(4-diphenylaminophenyl)-N-phenylamino]biphenyl (DPAB) and 4,4'-bis(N-{4-[N'-(3-methylphenyl)-N'-phenylamino]phenyl}-N-phenylamino)biphenyl (DNTPD), an aromatic amine such as 4,4',4''-tris[N-(3-methylphenyl)-N-phenylamino]triphenylamine (MTDAA) and 4,4',4''-tris(N,N-diphenylamino)triphenylamine (TDATA), a carbazole derivative, a thiophene derivative, and the like may be used. Alternatively, a polymeric compound such as poly(N-vinyl carbazole), poly(4-vinyltriphenylamine), poly[N,N'-bis(4-butylphenyl)-N,N'-bis(phenyl)benzidine], poly(3,4-ethylenedioxythiophene)/poly(styrenesulfonic acid), and polyaniline/poly(styrenesulfonic acid) may be used. Alternatively, an oxide of a transition metal such as molybdenum oxide, vanadium oxide, and zirconium oxide may also be used.

Alternatively, a composite material in which an organic compound is doped with an acceptor may be employed. In this case, a compound with a condensed aromatic ring such as anthracene derivative in addition to the aforementioned materials with a high hole-transporting property may be used as an organic compound. As an acceptor, not only a nitrogen-containing heteroaromatic compound and a heteroaromatic compound with a strong electron-withdrawing group such as a cyano group but also a transition metal oxide such as vanadium oxide, niobium oxide, tantalum oxide, chromium oxide, and molybdenum oxide are represented.

A thickness of the hole-injection layer 110 may be arbitrarily determined and may be selected from a range equal to or more than 10 nm and equal to or less than 200 nm, equal to or more than 20 nm and equal to or less than 100 nm, or equal to or more than 20 nm and equal to or less than 50 nm.

1-3. Hole-Transporting Layer

The hole-transporting layer 112 has a function to transport the holes injected to the hole-injection layer 110 toward the side of the emission layer 116. A hole-transporting material having a hole-transporting property higher than an electron-transporting property may also be used for the hole-transporting layer 112, and materials the same as or similar to the materials usable in the hole-injection layer 110 may be appropriately used. For example, a material which has a deeper HOMO level than the material used in the hole-injection layer 112 in which the difference in depth therebetween is equal to or less than 0.5 eV, equal to or less than 0.3 eV, or equal to or less than 0.1 eV may be used. Specifically, NPB such as 4,4'-bis [N-(1-naphthyl)-N-phenylamino]biphenyl (α-NPB) and 4,4'-bis[N-(2-naphtyle)-N-phenylamino]biphenyl (β-NPB), a benzidine derivative such as 4,4'-bis[N-(3-mehylphenyl)-N-phenylamino]biphenyl (TPD), and a carbazole derivative such as 4,4'-di(N-carbazolyl)biphenyl (CBP), and 1,3,5-tris[4-(N-carbazolyl)phenyl]benzene (TCPB) are exemplified.

A thickness of the hole-transporting layer 112 may also be arbitrarily determined and may be selected from a range equal to or more than 20 nm and equal to or less than 100 nm, equal to or more than 20 nm and equal to or less than 50 nm, or equal to or more than 30 nm and equal to or less than 50 nm.

1-4. Electron-Blocking Layer

The electron-blocking layer 114 has a function to transport the holes, which are transported from the anode 102, toward the side of the emission layer 116 and to prevent the electrons, which pass through the emission layer 116 from the cathode 104 side without undergoing recombination, from being transported toward the side of the hole-transporting layer 112. An electron-blocking material used in the electron-blocking layer 114 may also be selected from the hole-transporting materials usable in the hole-injection layer 110 or the hole-transporting layer 112. However, it is preferred to select a material so that a lowest unoccupied molecular orbital (LUMO) level thereof is higher (shallower) than a LUMO level of a host material (described below) used in the emission layer 116 and the difference therebetween is equal to or more than 0.2 eV and equal to or less than 0.5 eV or equal to or more than 0.3 eV and equal to or less than 0.5 eV in order to realize the function of effectively blocking the electrons. With this structure, the electrons can be confined in the emission layer 116, and the probability of recombination in the emission layer 116 can be increased.

A thickness of the electron-blocking layer 114 may also be arbitrarily determined and may be selected from a range equal to or more than 1 nm and equal to or less than 20 nm, equal to or more than 1 nm and equal to or less than 10 nm, or equal to or more than 1 nm and equal to or less than 5 nm. In the case of a thickness of equal to or more than 1 nm and equal to or less than 5 nm, the holes can be transported from the hole-transporting layer 112 to the emission layer 116 regardless of the energy barrier between the hole-transporting layer 112 to the emission layer 116 due to the tunnel effect.

Note that the materials used in the hole-transporting layer 112 and the electron-blocking layer 114 are each a hole-transporting material, and whether these materials are defined as an electron-blocking material depends on whether the materials sufficiently have a function for blocking the electrons from the emission layer 116. Specifically, a material is capable of functioning as an electron-blocking material if the LUMO level thereof is higher than the LUMO level of the host material included in the emission layer 116 and if the difference therebetween is equal to or more than 0.2 eV or equal to or more than 0.3 eV.

1-5. Emission Layer

The emission layer 116 is a layer providing a space in which the holes and the electrons recombine, and emission is obtained from the emission material included in this layer. The emission layer 116 may have the so-called host-guest type structure. That is, the emission layer 116 may contain the host material as a main component and a guest material included at a lower concentration than the host material as an emission material. As described below, the emission layer 116 further contains an additional component.

As the guest material, it is possible to use a stilbene derivative, a condensed aromatic compound such as an anthracene derivative, a carbazole derivative, a metal complex including a quinolinol ligand, an aromatic amine, a nitrogen-containing heteroaromatic compound such as phenanthroline derivative, and the like, for example. Specifically, it is possible to use a metal complex having an 8-quinolinol-based ligand, such as tris(8-quinolinolato)aluminum(III) (Alq), tris(4-methyl-8-quinolinolato)aluminum (III) (Almq$_3$), and bis(2-methyl-8-quinolinolato)(4-phenylphenolato)aluminum (III) (BAlq), an oxadiazole derivative such as 2-(biphenyl-4-yl)-5-(4-tert-butylphenyl)-1,3,4-oxadiazole (PBD) and 1,3-bis[5-(p-tert-butylphenyl)-1,3,4-oxadiazole-2-yl]benzene (OXD-7), a triazole derivative such as 3-(biphenyl-4-yl)-4-phenyl-5-(4-tert-butylphenyl)-1,2,4-triazole (TAZ) and 3-(4-tert-butylphenyl)-4-(4-ethylphenyl)-5-(4-biphenylyl)-1,2,4-triazole (p-EtTAZ), an imidazole derivative such as 2,2',2"-(1,3,5-benzenetriyl)tris(1-phenyl-1H-benzimidazole) (TPB) and 1,3,5-tris(1-phenyl-1H-benzimidazole-2-yl)benzene (TPBi), a phenanthroline derivative such as bathophenanthroline (BPhen) and bathocuproine (BCP), and a condensed aromatic compound such as 9,9'-(stilbene-3,3'-diyl)diphenanthrene (DPNS), 9,9'-(stilbene-4,4'-diyl)diphenanthrene (DPNS2), and 3,3',3"-(benzene-1,3,5-triyl) tripyrene (TPB) in addition to an anthracene derivative such as 9,10-bis(3,5-diphenylphenyl)anthracene (DPPA), 9,10-di (2-naphthyl)anthracene (DNA), 2-tert-butyl-9,10-di(2-naphthyl)anthracene (t-BuDNA), and 9,9'-bianthryl (BANT).

As the emission material, a fluorescent material such as a coumarin derivative, a pyran derivative, a quinacridone derivative, a tetracene derivative, a pyrene derivative, and an anthracene derivative or a phosphorescent material such as an iridium-based orthometal complex can be used. When the emission material is a phosphorescent material, it is preferred that the triplet level of the host material be higher than the triplet level of the emission material and that the difference therebetween be equal to or more than 0.2 eV and equal to or less than 0.7 eV, equal to or more than 0.3 eV and equal to or less than 0.6 eV, or equal to or more than 0.3 eV and equal to or less than 0.5 eV. More specifically, it is preferred to use a phenanthroline derivative, an oxadiazole derivative, a triazole derivative, or a metal complex with a relatively large band gap (e.g., equal to or more than 2.8 eV) such as BAlq as the host material.

There is no limitation to an emission wavelength of the emission material, and any of a blue-emissive material providing an emission peak wavelength in a region equal to or longer than 400 nm and equal to or shorter than 500 nm, a green-emissive material providing an emission peak wavelength in a region equal to or longer than 500 nm and equal to or shorter than 600 nm, and a red-emissive material providing an emission peak wavelength in a region equal to or longer than 600 nm and equal to or shorter than 700 nm may be used.

A thickness of the emission layer 116 may also be arbitrarily determined and may be selected from a range equal to or more than 20 nm and equal to or less than 60 nm, equal to or more than 20 nm and equal to or less than 50 nm, or equal to or more than 30 nm and equal to or less than 50 nm.

1-6. Hole-Blocking Layer

The hole-blocking layer 118 has a function to prevent the holes injected from the anode 102 from passing through the emission layer 116 without contributing to recombination and from being injected to the electron-transporting layer 120 so that the holes are confined in the emission layer 116 as well as a function to prevent the excited energy obtained in the emission layer 116 from being transferred to the molecules in the electron-transporting layer 120. These functions increase the probability of recombination in the emission layer 116 and prevent a decrease in emission efficiency.

In the hole-blocking layer 118, it is preferred to use, as a hole-blocking material, a material which has an electron-transporting property higher than or close to a hole-transporting property, which has a HOMO level deeper than the host material, and which has a band gap larger than the host material and the emission material. Specifically, the aforementioned BAlq, OXD-7, TAZ, p-EtTAZ, BPhen, BCP, and the like are represented as the host material, and a material may be selected so that a difference in HOMO level from the host material included in the emission layer 116 is equal to or more than 0.2 eV and equal to or less than 0.7 eV, equal to or more than 0.2 eV and equal to or less than 0.6 eV, or equal to or more than 0.2 eV and equal to or less than 0.5 eV. Furthermore, a material is preferred that has a band gap larger than that of the emission material by 0.2 eV or more and 0.7 eV or less, 0.2 eV or more and 0.6 eV or less, or 0.2 eV or more and 0.5 eV or less. When the emission material is a phosphorescent material, the hole-blocking material is preferably selected so that the triplet energy thereof is higher than that of the emission material.

A thickness of the hole-blocking layer 118 may also be arbitrarily determined and may be selected from a range equal to or more than 1 nm and equal to or less than 20 nm, equal to or more than 1 nm and equal to or less than 10 nm, or equal to or more than 1 nm and equal to or less than 5 nm. In the case of a thickness of equal to or more than 1 nm and equal to or less than 5 nm, it is possible to not only block the holes but also efficiently transport the electrons to the emission layer 116 regardless of the energy barrier between the electron-transporting layer 120 and the emission layer 116 due to the tunnel effect.

1-7. Electron-Transporting Layer

The electron-transporting layer 120 has a function to transport the electrons injected to the electron-injection layer 122 from the cathode 104 toward the side of the emission layer 116. The electron-transporting layer 120 includes a compound with an electron-transporting property higher than or similar to a hole-transporting property as an electron-transporting material, and, as such a material, a metal complex such as an aluminum complex, a lithium complex, and beryllium complex, an oxadiazole derivative, a triazole derivative, a silacyclopentadiene derivative, a condensed aromatic compound such as an anthracene derivative, a pyrene derivative, and a perylene derivative, a nitrogen-containing heteroaromatic compound such as a phenanthroline derivative, a sulfur-containing heteroaromatic compound such as a dibenzothiophene derivative, and the like are represented. As the aforementioned metal complex, a metal complex having an 8-quinolinol ligand such as 8-quinolinatolithium (Liq), Alq, and BAlq is exemplified, for example. As an example of a dibenzothiophene derivative, 2,8-bis(diphenylphosphoryl)dibenzo[b,d]thiophene (PPT) and the like are represented.

A thickness of the electron-transporting layer 120 may also be arbitrarily determined and may be selected from a range equal to or more than 20 nm and equal to or less than 60 nm, equal to or more than 20 nm and equal to or less than 50 nm, or equal to or more than 30 nm and equal to or less than 50 nm.

Note that the materials used for the hole-blocking layer 118 and the electron-transporting layer 120 are each an electron-transporting material, and whether these materials are defined as a hole-blocking material or not depends on whether they sufficiently have a function to block the holes transported from the emission layer 116. Specifically, a material functions as a hole-blocking material if the HOMO level thereof is lower than the HOMO level of the host material included in the emission layer 116 and a difference therebetween is equal to or more than 0.2 eV or 0.3 eV.

1-8. Electron-Injection Layer

The electron-injection layer 122 has a function to promote electron injection from the cathode 104. As an electron-injection material usable in the electron-injection layer 122, an inorganic compound such as lithium fluoride and calcium fluoride is represented. Alternatively, it is possible to use a mixture of an electron-transporting material usable for the electron-transporting layer 120 and an electron-donating material exemplified by Group 1 metals such as lithium, Group 2 metals such as magnesium and calcium, or a lanthanide metal such as ytterbium, for example. Typically, a mixture of Alq and Li and a mixture of Liq and Li are represented.

A thickness of the electron-injection layer 122 may also be arbitrarily determined and may be selected from a range equal to or more than 1 nm and equal to or less than 100 nm, equal to or more than 1 nm and equal to or less than 50 nm, or equal to or more than 1 nm and equal to or less than 20 nm.

1-9. Cathode

The cathode 104 has a function to inject electrons to the EL layer 106. Simultaneously, the cathode 104 functions as a reflective electrode in the case where the emission from the emission layer 116 is extracted from the anode 102 and as a light-extracting electrode partly reflecting and partly transmitting the emission in the case where the emission from the emission layer 116 is extracted from the cathode 104. When the cathode 104 is used as a reflective electrode, a film including a metal such as aluminum, magnesium, or silver or an alloy thereof and having a thickness capable of efficiently reflecting visible light is used as the cathode 104. On the other hand, when the cathode 104 is used as a light-extracting electrode, the cathode 104 is configured to include a conductive oxide having a light-transmitting property such as ITO and IZO. Alternatively, a metal film including the aforementioned metal and having a thickness allowing visible light to pass therethrough may be used. In this case, a stack in which a conductive oxide having a light-transmitting property is further stacked may be used.

2. Addition of Additional Component

In the light-emitting element 100, at least one functional layer in direct contact with the emission layer 116 (at least one of the hole-transporting layer 112, the electron-blocking layer 114, the hole-blocking layer 118, and the electron-transporting layer 120) is fabricated by co-evaporating two different materials. In that functional layer, a smaller amount of the additional component than the main component exists in a dispersed state in the main component together with the main component. Similarly, in the emission layer 116, a smaller amount of the additional component than the host material serving as the main component exists in a dispersed state in the layer together with the host material and the emission material.

Moreover, the layer located on the opposite side with respect to the emission layer 116 and in direct contact with the aforementioned functional layer which is in direct contact with the emission layer 116 (e.g., the hole-transporting layer 112 in contact with the electron-blocking layer 114 and the electron-transporting layer 120 in contact with the hole-blocking layer 118) also may be configured so that a smaller amount of the additional component than the main component exists in a dispersed state in the main component together with the main component structuring this layer. The additional components included in the emission layer 116 and the functional layers are the same as one another. As described below in detail, the use of such a structure efficiently prevents cross talk between adjacent light-emitting elements in a display device structured by a plurality of light-emitting elements. Hereinafter, a specific explanation is provided.

2-1. Case of Structure of Hole-Transporting Layer/Electron-Blocking Layer/Emission Layer When the light-emitting element 100 includes a stacked structure of the hole-transporting layer 112, the electron-blocking layer 114 in contact with the hole-transporting layer 112, and the emission layer 116 in contact with the electron-blocking layer 114 (e.g., in the case of the structure illustrated in FIG. 1A), a hole-transporting material, an electron-blocking material, and a host material and an emission material are respectively included in the hole-transporting layer 112, the electron-blocking layer 114, and the emission layer 116. In addition, the same material may be included as the additional component at least in the electron-blocking layer 114 and the emission layer 116.

Figure 2A:
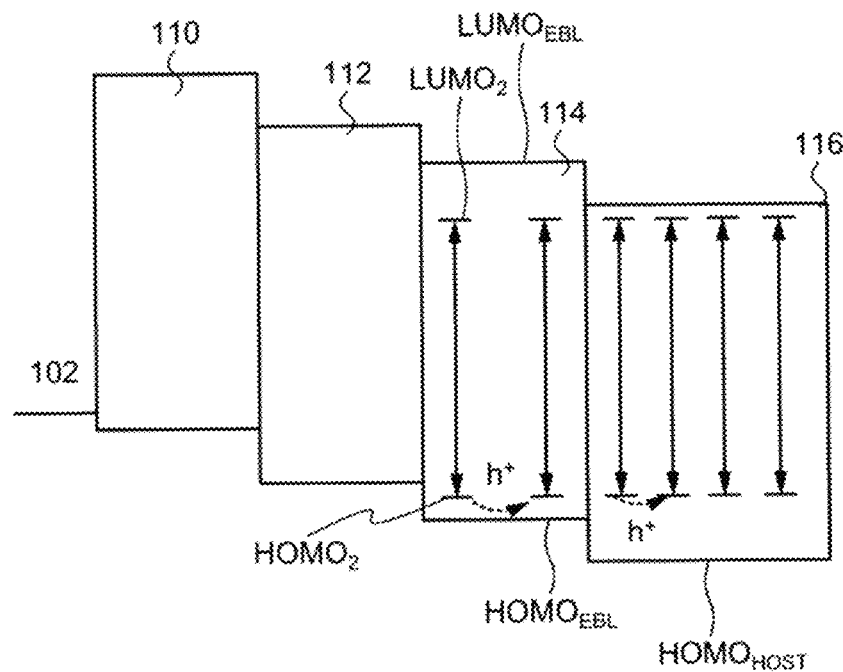
FIGS. 2A and 2B are each a schematic view showing a band structure of a light-emitting element according to an embodiment of the present invention.

As this additional component, although a material usable in the hole-injection layer 110, the hole-transporting layer 114, or the electron-blocking layer 114 may be selected, the additional component is selected so that a HOMO ($HOMO_2$) level of the additional component represented by a linear line with arrows at both edges is shallower than a HOMO ($HOMO_{EBL}$) level of the electron-blocking material and a HOMO ($HOMO_{HOST}$) level of the host material as shown in the band diagram in FIG. 2A. For instance, the additional component and the electron-blocking material are selected so that the difference between the $HOMO_2$ level of the additional component and the $HOMO_{EBL}$ level of the electron-blocking material is equal to or more than 0.2 eV. Furthermore, it is preferred that the additional component have a larger band gap than the emission material in order to prevent quenching in the emission layer 116. Note that a LUMO ($LUMO_2$) level of the additional component may be arbitrarily determined and may be lower or higher than the LUMO ($LUMO_{EBL}$) level of the electron-blocking layer 114, the LUMO ($LUMO_{Host}$) level of the host material, or a LUMO level of the emission material.

In each of the electron-blocking layer 114 and the emission layer 116, a volume fraction of the additional component is respectively lower than volume fractions of the electron-transporting material and the host material which are the main components. For example, the value fraction of the additional component may be equal to or more than 5 vol % and equal to or less than 30 vol %, equal to or more than 5 vol % and equal to or less than 20 vol %, or equal to or more than 5 vol % and equal to or less than 10 vol % in each of the electron-blocking layer 114 and the emission layer 116. The volume fractions of the additional component in the electron-blocking layer 114 and the emission layer 116 may be the same as or different from each other. When they are different, it is preferred to configure the light-emitting element 100 so that the volume fraction of the additional component in the emission layer 116 is lower than that in the electron-blocking layer 114. This is because the hole trapping described below more efficiently takes place in the emission layer 116 since the $HOMO_{Host}$ level of the host material is usually deeper than the $HOMO_{EBL}$ level of the electron-blocking material.

As a specific combination of the electron-blocking material, the host material, and the additional component, a combination in which the electron-blocking material, the host material, and the additional component are respectively MTDATA, CBA, and NPB, a combination in which the electron-blocking material, the host material, and the additional component are respectively MTDATA, CBP, and α-NDP, a combination in which the electron-blocking material, the host material, and the additional component are respectively TPD, CBP, and NPB, and the like are represented.

Figure 2B:
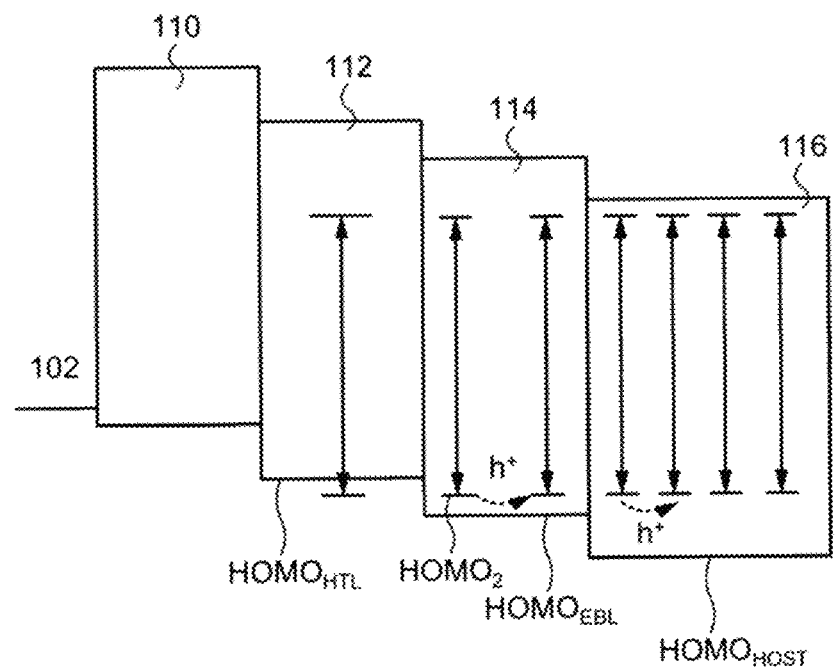

Note that the additional component may also be included in the hole-transporting layer 112. That is, the additional component the same as the additional component included in the electron-blocking layer 114 and the emission layer 116 may also be included in the hole-transporting layer 112, and the additional component may be dispersed in the hole-transporting material which is the main component in the hole-transporting layer 112 (FIG. 2B). The $HOMO_2$ level of the additional component may be deeper than, the same as, or shallower than a HOMO ($HOMO_{HTL}$) level of the hole-transporting material. In addition, the volume fraction of the additional component in the hole-transporting layer 112 may be the same as or different from those in the electron-blocking layer 114 and the emission layer 116. Similar to the electron-blocking layer 114 and the emission layer 116, the volume fraction of the additional component in the hole-transporting layer 112 may be equal to or more than 5 vol % and equal to or less than 30 vol %, equal to or more than 5 vol % and equal to or less than 20 vol %, or equal to or more than 5 vol % and equal to or less than 10 vol %. Furthermore, the light-emitting element 100 may be configured so that the volume fractions of the additional component decrease in the order of the hole-transporting layer 112, the electron-blocking layer 114, and the emission layer 116.

When the additional component is also included in the hole-transporting layer 112, a combination in which the hole-transporting material, the electron-blocking material, the host material, and the additional component are respectively TDATA, TPD, CBP, and α-NPD, a combination in which the hole-transporting material, the electron-blocking material, the host material, and the additional component are respectively MTDATA, TPD, CBP, and β-NPB, and the like are represented as specific combinations of the hole-transporting material, the electron-blocking material, the host material, and the additional component, for example.

Alternatively, the hole-transporting layer 112 may be composed of the additional component. That is, the hole-transporting layer 112 may consist of one kind of hole-transporting material, and the electron-blocking layer 114 and the emission layer 116 may include the hole-transporting material structuring the hole-transporting layer 112 as the additional component. Alternatively, the hole-transporting layer 112 may include the additional component included in the electron-blocking layer 114 and the emission layer 116 as the main component.

In the case where the hole-transporting layer 112 is composed of the additional component, a combination in which the electron-blocking material, the host material, and the additional component are respectively TPD, CBP, and α-NPD, a combination in which the electron-blocking material, the host material, and the additional component are respectively TPD, CBP, and β-NPB, and the like are represented as specific combinations of the electron-blocking material, the host material, and the additional component.

Although not illustrated, the additional component the same as the additional component included in the emission layer 116 and the like may be included in the hole-injection layer 110.

In such a structure, the holes ($h^+$) transported from the side of the anode 102 through the hole-transporting layer 112 are first injected to the electron-blocking layer 114 (FIG. 2A). At this time, the holes enter the $HOMO_{EBL}$ of the electron-blocking material or the $HOMO_2$ of the additional component, and the holes which once enter the $HOMO_{EBL}$ of the electron-blocking material are immediately transferred to the $HOMO_2$ of the additional component having a shallower level. As described above, the volume fraction, i.e., the concentration, of the additional component in the electron-blocking layer 114 is lower than that of the electron-blocking material. Thus, the probability that the holes hop between the additional components dispersed in the electron-blocking layer 114 (the dotted arrow in FIG. 2A) is low, and it is necessary to supply a voltage to overcome the energy barrier corresponding to the difference in HOMO level between the additional component and the electron-blocking material. In other words, the additional component functions as a hole-trapping material providing a hole-trapping site in the hole-blocking layer 114. As a result, the hole-transporting property of the whole of the electron-blocking layer 114 decreases. Since the $HOMO_2$ level of the additional component is also shallower than the $HOMO_{Host}$ of the host material in the emission layer 116, the holes are trapped in a similar way. Moreover, the holes are more strongly trapped in the emission layer 116 because the $HOMO_{Host}$ of the host material is deeper than the $HOMO_{EBL}$ of the electron-blocking material. The same is applied to the case where the hole-transporting layer 112 is composed of a hole-transporting material and an additional component with a HOMO level shallower than that of the hole-transporting material so that the holes are trapped in the hole-transporting layer 112. Hence, the hole-transporting property decreases in the light-emitting element 100.

The decrease in hole-transporting property in the light-emitting element 100 leads to an increase in an emission threshold voltage but causes no significant increase in a driving voltage. The reason is as follows. A voltage applied to cause the light-emitting element 100 to illuminate at a practical luminance is higher than the emission threshold voltage, and a sufficient amount of holes is injected from the anode 102 through the hole-injection layer 110. At this time, although a part of the holes is trapped by the additional component, most holes are transferred through the $HOMO_{EBL}$ of the electron-blocking material and the $HOMO_{Host}$ of the host material because the concentrations of the additional component are lower than those of the main components in the hole-transporting layer 112, the electron-blocking layer 114, and the emission layer 116. That is, the influence on the driving voltage itself can be almost ignored because the contribution of the hole transportation through the $HOMO_2$ of the additional component is relatively small at a high voltage for providing a practical luminance.

Figure 3A:
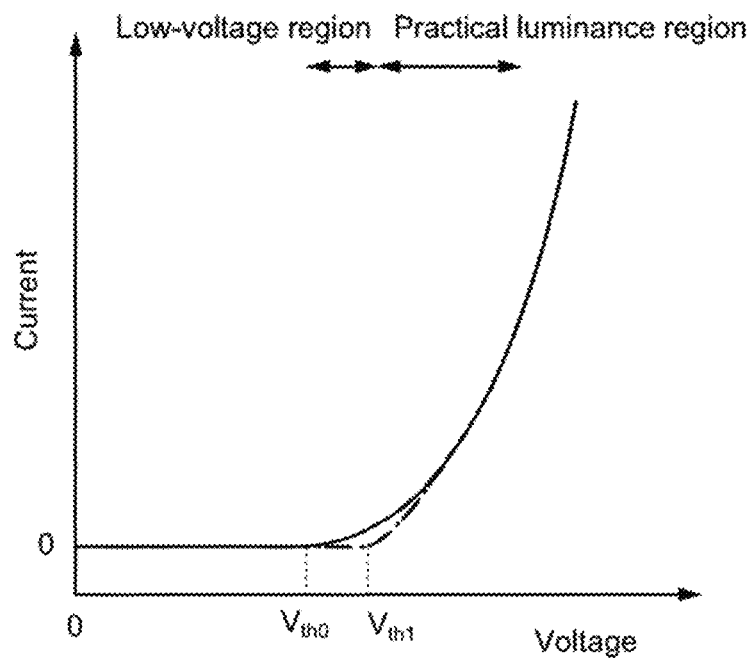
FIG. 3A is a schematic view of a V-I curve of a light-emitting element.

This phenomenon can be explained by the schematic V-I curve depicted in FIG. 3A. The addition of the additional component results in the formation of the hole-trapping sites in the hole-transporting layer 112 and/or the electron-blocking layer 114 and the emission layer 116. Hence, the hole transportation is inhibited at a low voltage, and accordingly, the emission threshold voltage shifts to $V_{th1}$ from the emission threshold voltage $V_{th0}$ ($V_{th1} > V_{th0}$) in the case where no additional component is added (see the chain line in FIG. 3A). However, in a practical luminance region, the contribution of the $HOMO_2$ to the hole transportation is small, and the holes are transported through the $HOMO_{HTL}$, the $HOMO_{EBL}$, and the $HOMO_{Host}$ because a sufficiently high voltage is applied between the anode 102 and the cathode 104. As a result, a V-I curve similar to that of a light-emitting element to which no additional component is added is provided in the practical luminance region.

Since the use of the additional component in this manner enables an increase in emission threshold voltage without a substantial increase in a driving voltage, it is possible to prevent a decrease in display quality caused by cross talk (emission of adjacent light-emitting elements due to the current leak in a transverse direction) by applying the light-emitting element 100 according to an embodiment of the present application to a display device. This effect is explained using FIG. 3B.

Figure 3B:
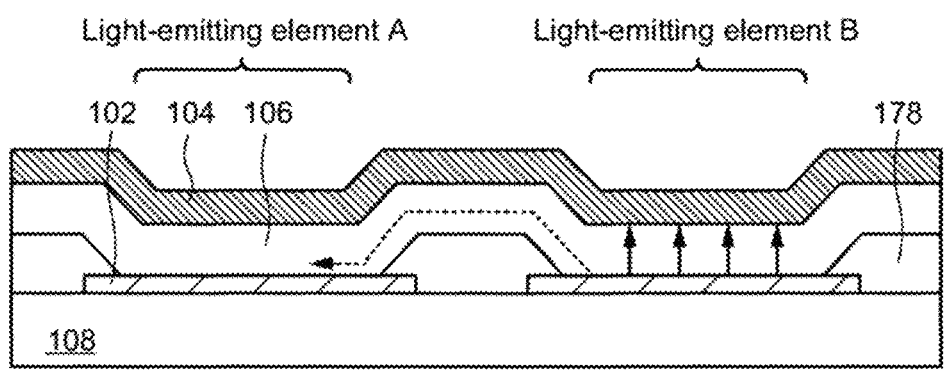
FIG. 3B is a schematic cross-sectional view showing a cross talk between light-emitting elements.

As illustrated in FIG. 3B, the plurality of anodes 102 is disposed over a substrate 108 as pixel electrodes in a display device, and edge portions of the anodes 102 are protected by an insulating film called a partition 178, for example. The EL layer 106 and the cathode 104 are provided over the anodes 102 and the partition 178. A region (emission region) in which the anode 102 is exposed from the partition 178 corresponds to each light-emitting element (light-emitting elements A and B in the drawing). A constant voltage (Vss) is applied to the cathode 104. The anodes 102 are applied with potentials based on image data for a constant period or applied with a constant voltage (Vdd) higher than Vss for a period based on the image data. With this operation, gradation is controlled in each light-emitting element to display an image.

When one of the light-emitting elements (the light-emitting element B on a right side in FIG. 3B) is driven, a current flows in the EL layer 106 due to the potential difference between the anode 102 and the cathode 104. This current is called a space charge limited current and flows from the anode 102 to the cathode 104 in a direction perpendicular to the surface of the anode 102 (see bold arrows). The magnitude of the space charge limited current is inversely proportional to the cube of a film thickness (the thickness of the EL layer 106 in this case). On the other hand, the current (dotted arrow) flowing in the direction parallel to the surface of the anode 102 does not include the space-charge limited current, and the Ohm rule is applied thereto because a distance between adjacent light-emitting elements is larger than the thickness of the EL layer 106. The EL layer 106 itself merely has a conductivity considered to be that of an insulator. Hence, the Ohm current can be usually ignored, and the space charge limited current dominates in the EL layer 106. As a result, the injected holes and electrons are not transported to the adjacent light-emitting element A, and emission is selectively obtained by the selected light-emitting element.

However, the Ohm current cannot be ignored when the carrier-transporting property of all of or a part of the functional layers structuring the EL layer 106 is increased. Particularly, in the case where the distance between adjacent light-emitting elements is decreased by decreasing a width of the partition 178 in order to increase the resolution of a display device, the influence of the Ohm current is materialized, and, accordingly, the leak current shown by the dotted arrow flows to the adjacent light-emitting element A. The voltage of the of the leak current in the light-emitting element A is relatively low because the current flowing through this route undergoes an extremely large voltage drop when flowing in the EL layer 106 over the partition 178. However, emission occurs in the emission layer if the emission threshold voltage of the light-emitting element A is low, leading to unintentional emission of the light-emitting element A. This phenomenon is cross talk. If cross talk takes place, the emission of the light-emitting element A is mixed when the light-emitting element B is driven, thereby decreasing display quality. Particularly, when the light-emitting element A is a red or green-emissive light-emitting element having a low emission threshold voltage, cross talk readily occurs.

On the contrary, the emission threshold voltage increases in the light-emitting element 100 according to an embodiment of the present invention because the same additional component is added to the emission layer 116 as well as the functional layer in contact with the emission layer 116 (the electron-blocking layer 114 in the aforementioned example) and another functional layer, which is in contact with the functional layer and is positioned on an opposite side with respect to the emission layer 116 (the hole-transporting layer 112 in the aforementioned example). Accordingly, application of the structure of the light-emitting element 100 to the light-emitting element A does not allow the light-emitting element A to emit light and prevents cross talk even if the leak current is injected to the light-emitting element A from the adjacent light-emitting element B. On the other hand, when the light-emitting element A is driven, the driving voltage does not increase because it can be driven by a voltage similar to that of an element to which no additional component is added. Hence, it is possible to prevent a decrease in display quality caused by cross talk without any increase in power consumption by using the light-emitting element 100 according to an embodiment of the present invention in a display device.

2-2. Case of Structure of Hole-Transporting Layer/Emission Layer

Figure 4:
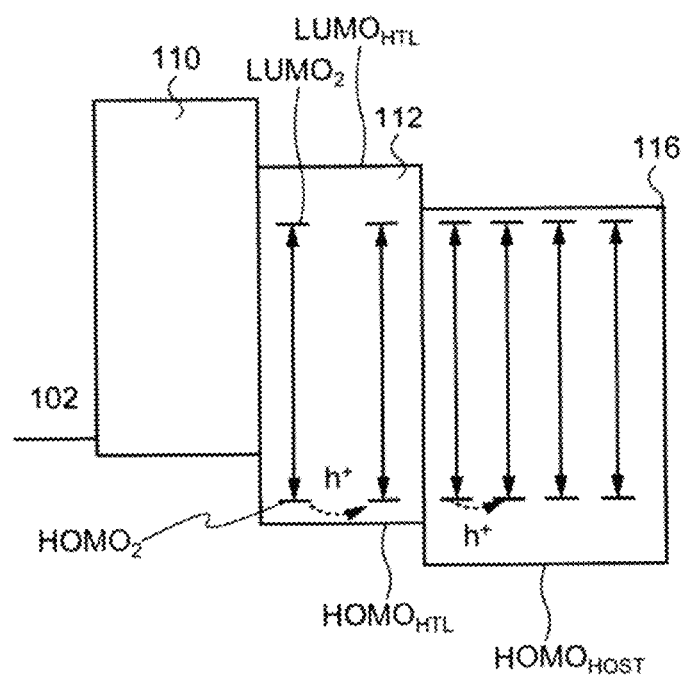
FIG. 4 is a schematic view showing a band structure of a light-emitting element according to an embodiment of the present invention.

When the light-emitting element 100 does not include the electron-blocking layer 114 but includes a stacked structure of the hole-transporting layer 112 and the emission layer 116 in contact with the hole-transporting layer 112 (e.g., in the case of the structure shown in FIG. 1B), the additional component in addition to the hole-transporting material may be included in the hole-transporting layer 112, and the additional component the same as the additional component included in the hole-transporting layer 112 is further included in the emission layer 116 in addition to the host material and the emission material (FIG. 4).

Although the materials usable in the hole-injection layer 110, the hole-transporting layer 112, or the electron-blocking layer 114 may be selected as this additional component, the additional component is selected so that the $HOMO_2$ level of the additional component is shallower than the $HOMO_{HTL}$ level of the hole-transporting material and the $HOMO_{Host}$ level of the host material as shown in FIG. 4. Moreover, it is preferred that the additional component have a bang gap larger than the emission material in order to prevent quenching in the emission layer 116. Note that the $LUMO_2$ level of the additional component may be arbitrarily determined and may be lower than or higher than a LUMO ($LUMO_{HTL}$)

level of the hole-transporting material, the $LUMO_{Host}$ level of the host material, or the LUMO level of the emission material.

In each of the hole-transporting layer 112 and the emission layer 116, the volume fraction of the additional component is lower than the volume fraction of the hole-transporting material or the host material serving as the main component. For example, in each of the hole-transporting layer 112 and the emission layer 116, the volume fraction of the additional component may be equal to or more than 5 vol % and equal to or less than 30 vol %, equal to or more than 5 vol % and equal to or less than 20 vol %, or equal to or more than 5 vol % and equal to or less than 10 vol %. The volume fractions of the additional component in the hole-transporting layer 112 and the emission layer 116 may be the same as or different from each other. When the volume fractions are different, the light-emitting element 100 is preferably configured so that the volume fraction of the additional component in the hole-transporting layer 112 is larger than that in the emission layer 116. This is because the $HOMO_{Host}$ level of the host material is usually deeper than the $HOMO_{HTL}$ level of the hole-transporting layer 112, by which a high hole-trapping property can be attained even at a low concentration of the additional component.

In the case of this structure, a combination in which the hole-transporting material, the host material, and the additional component are respectively MTDATA, CBP, and α-NPD or a combination in which the hole-transporting material, the host material, and the additional component are respectively MTDATA, CBP, and β-NPB are represented as specific combinations of the hole-transporting material, the host material, and the additional component, for example.

In this structure, although the holes are trapped in the hole-transporting layer 112 and the emission layer 116 to cause an increase in an emission threshold voltage, the influence on the driving voltage is negligibly small in the practical luminance region. Hence, the use of the light-emitting element 100 according to an embodiment of the present invention in a display device prevents a decrease in display quality caused by cross talk without increasing power consumption.

Figure 5A:
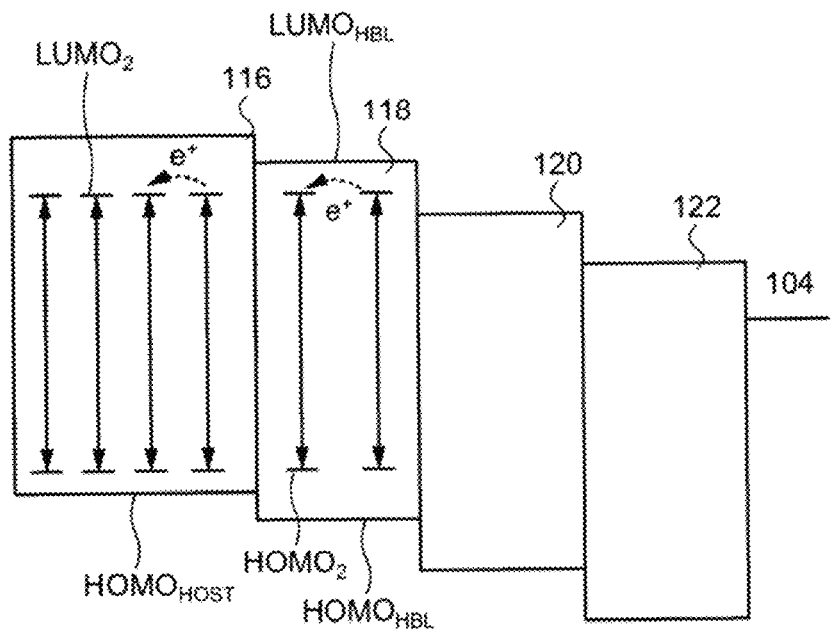
FIGS. 5A and 5B are each a schematic view showing a band structure of a light-emitting element according to an embodiment of the present invention.

2-3. Case of Structure of Emission Layer/Hole-Blocking Layer/Electron-Transporting Layer When the light-emitting element 100 includes a stacked structure of the emission layer 116, the hole-blocking layer 118 in contact with the emission layer 116, and the electron-transporting layer 120 in contact with the hole-blocking layer 118 (e.g., the case of the structure depicted in FIG. 1A), the electron-transporting material, the hole-blocking material, and the host and emission materials are respectively included in the electron-transporting layer 120, the hole-blocking layer 118, and the emission layer 116. Furthermore, the same material may be included in the hole-blocking layer 118 and the emission layer 116 as the additional component (FIG. 5A).

Although a material usable in the electron-transporting layer 120 or the hole-blocking layer 118 may be selected as this additional component, the additional component is selected so that the $LUMO_2$ level of the additional component is deeper than a $LUMO_{HBL}$ level of the hole-blocking material and the $LUMO_{Host}$ level of the host material. For example, the additional component is selected so that differences between the $LUMO_2$ level of the additional component and the $LUMO_{HBL}$ level of the hole-blocking material and between the $LUMO_2$ level of the additional component and the $LUMO_{Host}$ level of the host material are each 0.2 eV or more. In addition, the additional component preferably has a band gap larger than the emission material in order to prevent quenching in the emission layer 116. Note that the $HOMO_2$ level of the additional component may be arbitrarily determined and may be lower than or higher than a HOMO ($HOMO_{HBL}$) level of the hole-blocking layer 118, the $HOMO_{Host}$ level of the host material, and a HOMO level of the emission material.

In each of the hole-blocking layer 118 and the emission layer 116, the volume fraction of the additional component is lower than the volume fractions of the hole-blocking material or the host material serving as the main component. For example, the volume fraction of the additional component may be equal to or more than 5 vol % and equal to or less than 30 vol %, equal to or more than 5 vol % and equal to or less than 20 vol %, or equal to or more than 5 vol % and equal to or less than 10 vol % in each of the hole-blocking layer 118 and the emission layer 116. The volume fractions of the additional component in the hole-blocking layer 118 and the emission layer 116 may be the same as or different from each other. When the volume fractions are different, the light-emitting element 100 is preferably configured so that the volume fraction of the additional component in the hole-blocking layer 118 is larger than that in the emission layer 116. This is because the $LUMO_{Host}$ level of the host material is usually shallower than the LUMO ($LUMO_{HBL}$) level of the hole-blocking material, which readily causes the electron trapping described below in the emission layer 116.

Figure 5B:
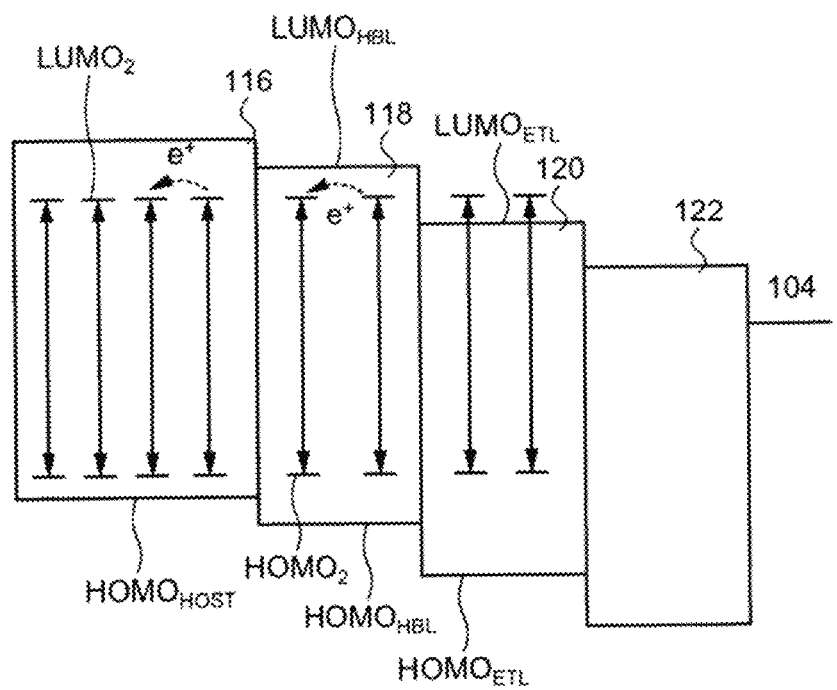

Note that the additional component may also be included in the electron-transporting layer 120. That is, the additional component the same as the additional component included in the hole-blocking layer 118 and the emission layer 116 may also be included in the electron-transporting layer 120 and may be dispersed in the electron-transporting material serving as the main component in the electron-transporting layer 120 (FIG. 5B). The $LUMO_2$ level of the additional component may be deeper than, the same as, or shallower than a LUMO ($LUMO_{ETL}$) level of the electron-transporting material. Moreover, the volume fraction of the additional component in the electron-transporting layer 120 may be the same as or different from that in the hole-blocking layer 118 or the emission layer 116. Similar to the hole-blocking layer 118 and the emission layer 116, the volume fraction of the additional component in the electron-transporting layer 120 may be equal to or more than 5 vol % and equal to or less than 30 vol %, equal to or more than 5 vol % and equal to or less than 20 vol %, or equal to or more than 5 vol % and equal to or less than 10 vol %.

Alternatively, the electron-transporting layer 120 may be composed of the additional component. That is, the electron-transporting layer 120 may consist of one electron-transporting material, and the hole-blocking layer 118 and the emission layer 116 may include the electron-transporting material structuring the electron-transporting layer 120 as the additional component. Alternatively, the electron-transporting layer 120 may include, as the main component, the additional component included in the hole-blocking layer 118 and the emission layer 116.

Although not illustrated, the additional component may also be included in the electron-injection layer 122.

In such a structure, the electrons (e⁻) transported from the side of the cathode 104 through the electron-transporting layer 120 are first injected to the hole-blocking layer 118 (FIG. 5A). At this time, the electrons enter the $LUMO_{HBL}$ of the hole-blocking material or the $LUMO_2$ of the additional component, and electrons which once enter the $LUMO_{HBL}$ of the hole-blocking material are transferred to the $LUMO_2$ of the additional component having a deeper level. As described above, the volume fraction, that is, a concentration, of the additional component is lower than that of the hole-blocking material. Hence, the probability that the electrons hop between the additional components dispersed in the hole-blocking layer 118 (dotted arrow in FIG. 5A) is low, and it is necessary to supply a voltage to overcome the energy barrier corresponding to the difference in LUMO level between the additional component and the hole-blocking material. In other words, the additional component functions as an electron-trapping material providing an electron-trapping site in the hole-blocking layer 118. Accordingly, the electron-transporting property of the whole of the hole-blocking layer 118 decreases. The electrons are similarly trapped in the emission layer 116 because the $LUMO_2$ level of the additional component is deeper than the $LUMO_{Host}$ level of the host material. Furthermore, the electrons are more strongly trapped in the emission layer 116 because the $LUMO_{Host}$ level of the host material is usually shallower than the $LUMO_{HBL}$ level of the hole-blocking material. The same is applied to the case where the electron-transporting layer 120 is composed of an electron-transporting material as well as the additional component having a deeper LUMO level than the electron-transporting material, and the electrons are trapped in the electron-transporting layer 120. Hence, the electron-transporting property decreases in the light-emitting element 100.

Such a decrease in the electron-transporting property leads to an increase in an emission threshold voltage similar to the aforementioned decrease in the hole-transporting property caused by the additional component but does not cause a significant increase in a driving voltage. The reason is as follows. The voltage applied when the light-emitting element 100 is caused to illuminate at a practical luminance is higher than the emission threshold voltage, and a sufficient amount of electrons is injected from the cathode 104 through the electron-injection layer 122. At this time, although a part of the electrons is trapped by the additional component, most electrons are transferred through the $LUMO_{HBL}$ of the hole-blocking material and the $LUMO_{Host}$ of the host material because the concentrations of the additional component are lower than the concentrations of the hole-blocking material and the host material serving as the main components in the hole-blocking layer 118 and the emission layer 116. That is, the influence on the driving voltage itself can be almost ignored because the contribution of the electron transportation through the $LUMO_2$ of the additional component is relatively small at a high voltage for providing a practical luminance. Hence, it is possible to prevent a decrease in display quality caused by cross talk without increasing power consumption by using the light-emitting element 100 according to an embodiment of the present invention in a display device.

2-4. Case of Structure of Emission Layer/Electron-Blocking Layer

Figure 6:
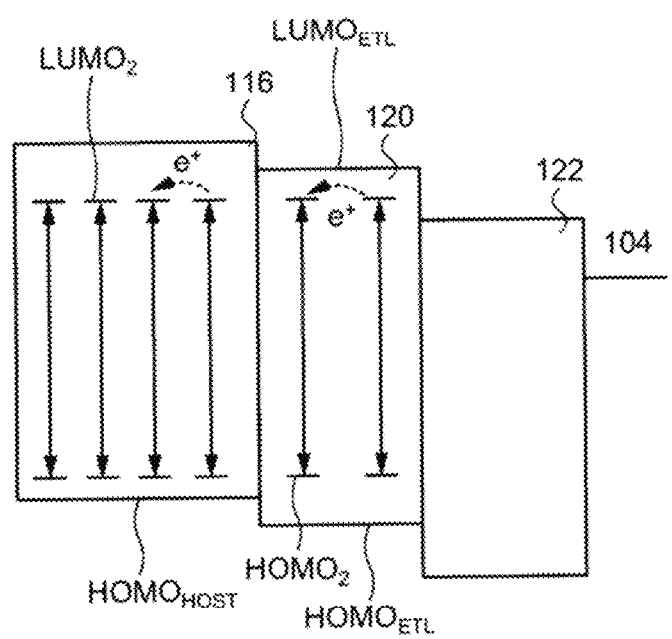
FIG. 6 is a schematic view showing a band structure of a light-emitting element according to an embodiment of the present invention.

In the case where the light-emitting element 100 does not include the hole-blocking layer 118 but has a stacked structure of the light-emitting layer 116 and the electron-transporting layer 120 in contact with the emission layer 116 (e.g., the case of the structure depicted in FIG. 1C), the additional component in addition to the electron-transporting material may be included in the electron-transporting layer 120, and the additional component the same as the additional component included in the electron-transporting layer 120 may be included in addition to the host material and the emission material in the emission layer 116 (FIG. 6).

Although the material usable in the electron-transporting layer 120 or the hole-blocking layer 118 may be selected as this additional component, the additional component is selected so that the $LUMO_2$ level of the additional component is deeper than the $LUMO_{ETL}$ level of the electron-transporting material and the $LUMO_{Host}$ level of the host material. In addition, the additional component preferably has a band gap larger than the emission material in order to prevent quenching in the emission layer 116. Note that the $HOMO_2$ level of the additional component may be arbitrarily determined and may be deeper or shallower than the $HOMO_{ETL}$ level of the electron-transporting material, the $HOMO_{Host}$ level of the host material, or the HOMO level of the emission material.

In each of the electron-transporting layer 120 and the emission layer 116, the volume fraction of the additional component is lower than the volume fractions of the electron-transporting material and the host material serving as the main component. For example, the volume fraction of the additional component may be equal to or more than 5 vol % and equal to or less than 30 vol %, equal to or more than 5 vol % and equal to or less than 20 vol %, or equal to or more than 5 vol % and equal to or less than 10 vol % in each of the electron-transporting layer 120 and the emission layer 116. The volume fractions of the additional component in the electron-transporting layer 120 and the emission layer 116 may be the same as or different from each other. When the volume fractions are different, the light-emitting element 100 is preferably configured so that the volume fraction of the additional component in the electron-transporting layer 120 is larger than that in the emission layer 116. This is because the $LUMO_{Host}$ level of the host material is usually shallower than the $LUMO_{ETL}$ level of the electron-transporting layer 120, by which a high electron-trapping property can be obtained even at a low concentration of the additional component.

In the case of this structure, a combination in which the electron-transporting material, the host material, and the additional component are respectively TPBi, CBP, and Alq, a combination in which the electron-transporting material, the host material, and the additional component are respectively PPT, CBP, and Alq, and the like are represented as specific combinations of the electron-transporting material, the host material, and the additional component, for example.

In this structure, although the electrons are trapped in the electron-transporting layer 120 and the emission layer 116 to cause an increase in an emission threshold voltage, the influence on the driving voltage is negligibly small in the practical luminance region. Hence, the use of the light-emitting element 100 according to an embodiment of the present invention in a display device prevents a decrease in display quality caused by cross talk without increasing power consumption.

Second Embodiment

In the present embodiment, a display device 150 including the light-emitting element 100 according to an embodiment of the present invention is explained. An explanation of the structure the same as or similar to that described in the First Embodiment may be omitted.

1. Outline Structure

Figure 7:
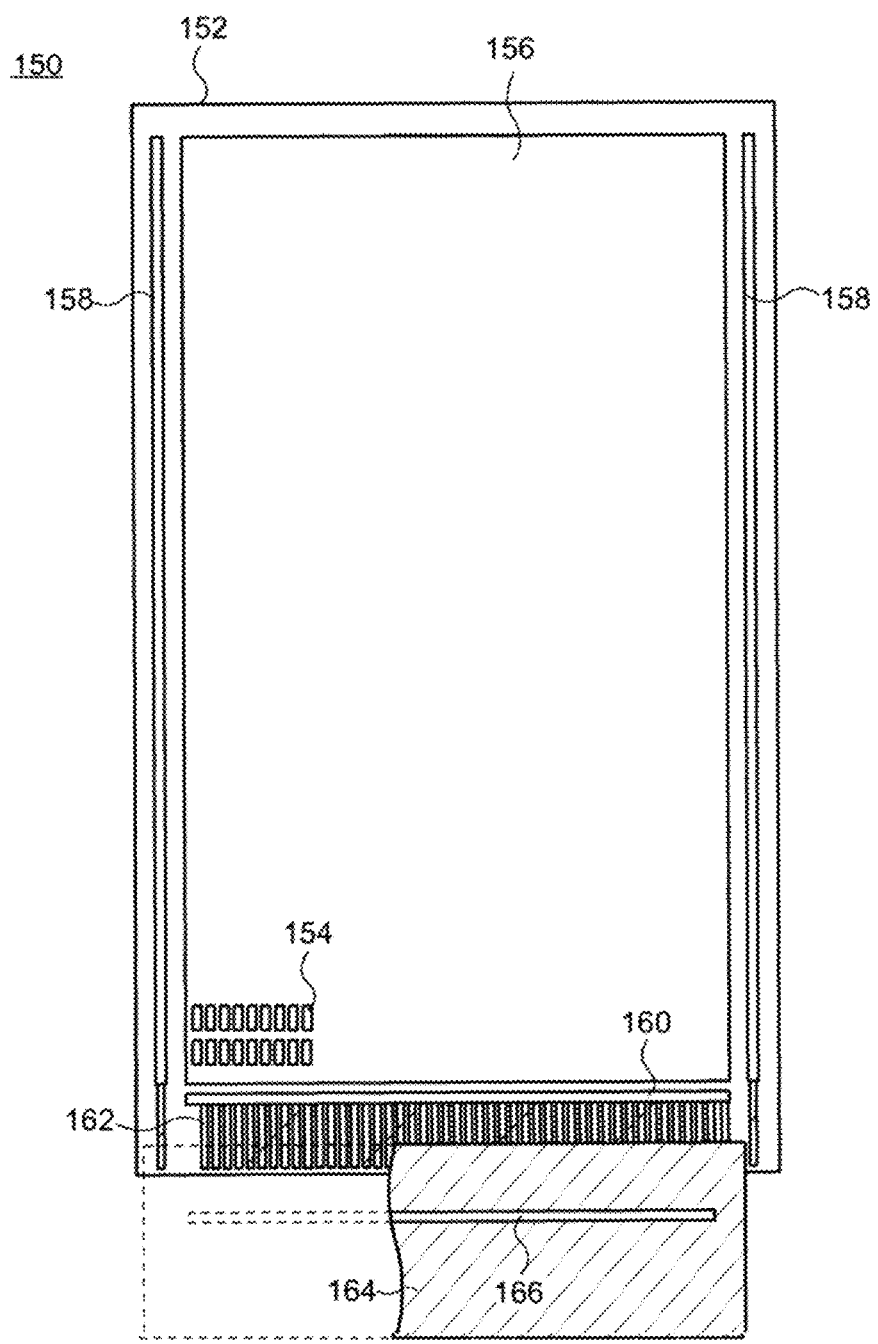
FIG. 7 is a schematic top view of a display device according to an embodiment of the present invention.
Figure 8:
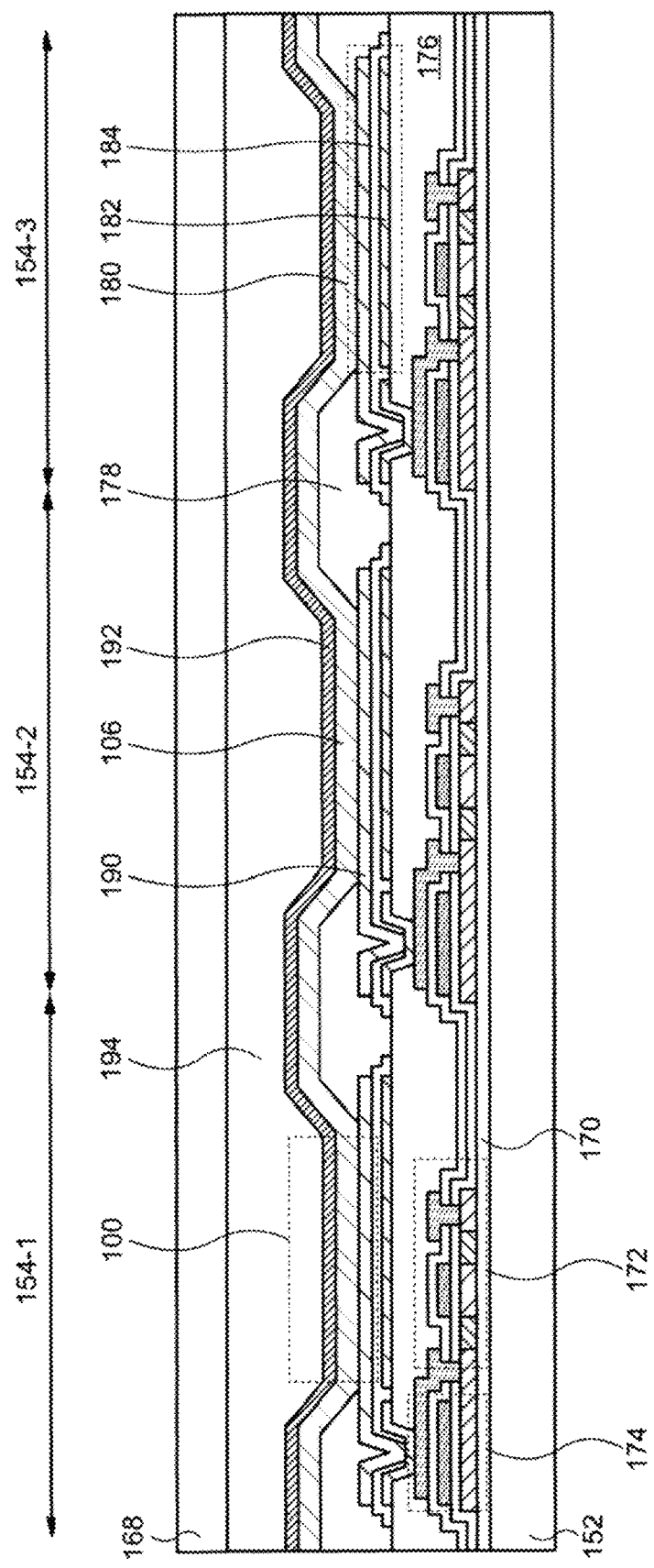
FIG. 8 is a schematic cross-sectional view of a display device according to an embodiment of the present invention.

Schematic top and cross-sectional views of the display device 150 are respectively shown in FIG. 7 and FIG. 8. The display device 150 has an array substrate 152 and a counter substrate 168 opposing the array substrate 152, and a plurality of pixels 154 is disposed over the array substrate 152. A region in which the plurality of pixels 154 is arranged is a display region 156, and scanning-line driver circuits 158 for controlling the pixels 154 are disposed outside the display region 156 (peripheral region) over the array substrate 152. The counter substrate 168 is arranged over the pixels 154 and the scanning-line driver circuits 158 to protect these elements. Wirings extend from the display region 156 and the scanning-line driver circuits 158 to a side of the array substrate 152 and are electrically connected to a flexible printed circuit substrate (FPC) 164 at an edge portion of the array substrate 152. A driver IC 166 for controlling the pixels 154 may be mounted over the FPC 164. Note that the driver IC 166 may not be disposed over the FPC 116 but may be mounted over the array substrate 152, or a signal-line driver circuit 160 may be formed over the array substrate 152 instead of or together with the driver IC 166.

The plurality of pixels 154 is composed of pixels providing red, green, and blue colors providing the three primary colors. That is, the plurality of pixels 154 is composed of a plurality of pixels providing red color, a plurality of pixels providing green color, and a plurality of pixels providing blue color, and each of the plurality of pixels 154 is provided with a light-emitting element and a pixel circuit for controlling the light-emitting element. There is no limitation to the structure of the pixel circuit, and the pixel circuit may include a variety of elements such as a plurality of transistors and one or more capacitor elements. The pixel circuits are controlled with the signals supplied from an external circuit (not illustrated) through the scanning-driver circuits 158, the driver IC 166, and the signal-line driver circuit 160. Control of the emission obtained from the light-emitting elements allows an image to be displayed in the display region 156.

Here, the light-emitting element 100 described in the First Embodiment is disposed in at least one of the plurality of pixels 154 structuring the display region 156. For example, the light-emitting element 100 is formed in each of the plurality of pixels 154 providing red color. Alternatively, the light-emitting element 100 is formed in each of the plurality of pixels 154 providing red color and the plurality of pixels 154 providing green color. Alternatively, the light-emitting element 100 may be disposed in every pixel 154.

2. Cross-Sectional Structure

FIG. 8 is a schematic cross-sectional view of three pixels 154 (first pixel 154-1, second pixel 154-2, and third pixel 154-3) formed over the array substrate 152. Here, cross-sectional structures of driving transistors 172, storage capacitor elements 174, and supplemental capacitor elements 180 among the elements structuring the pixel circuits as well as the light-emitting elements 100 included in each pixel 154 are demonstrated, and a detailed structure of the EL layers 106 is omitted. Since each element structuring the pixel element such as the driving transistor 172, the storage capacitor element 174, and the supplemental capacitor elements 180 may have known structures, a detailed explanation thereof is omitted.

Each element included in the pixel circuit is disposed over the array substrate 152 through an undercoat 170. A planarization film 176 is formed over the driving transistors 172 and the storage capacitor elements 174. The planarization film 176 has openings to expose the storage capacitor elements 174 through which the supplemental capacitor elements 180 and the light-emitting elements 100 are electrically connected to the storage capacitor elements 174 and the driving transistors 172. Note that, in the display device 150 shown in FIG. 8, the supplemental capacitor element 180 is composed of a capacitor electrode 182, a capacitor insulating film 184 over the capacitor electrode 182 over the planarization film 176, and a pixel electrode 190 over the capacitor insulating film 184.

Edge portions of the pixel electrodes 190 are covered by a partition 178, and the EL layers 106 are disposed over the pixel electrodes 190 and the partition 178. A common electrode 192 overlapping the plurality of pixel electrodes 190 is disposed over the EL layers 106. Hence, each pixel electrode 190 is disposed in every pixel 154 and independently structures a part of the light-emitting element 100, while the common electrode 192 is shared by the plurality of pixels 154. The pair of pixel electrode 190 and the common electrode 192 corresponds to the pair of the anode 102 and the cathode 104 of the light-emitting element 100. Hereinafter, a case is explained where the pixel electrode 190 corresponds to the anode 102.

The display device 150 may further include, as an optional structure, a passivation film 194 for protecting the light-emitting elements 100 between the light-emitting elements 100 and the counter substrate 168. The passivation film 194 may also be configured by applying known structures and materials.

3. Structure of Light-Emitting Element Disposed in Pixel

Schematic cross-sectional views of three pixels (first pixel 154-1, second pixel 154-2, and third pixel 154-3) continuously arranged in the display device 150 and providing emission colors different one another are shown in FIG. 9A to FIG. 10B. Hereinafter, a mode is described where the first pixel 154-1, the second pixel 154-2, and the third pixel 154-3 respectively provide red, green, and blue emissions. Note that the components on a side of the array substrate 152 from the planarization film 176 are not illustrated in these drawings.

3-1. Case where Light-Emitting Elements 100 are Arranged in all Pixels

Figure 9A:
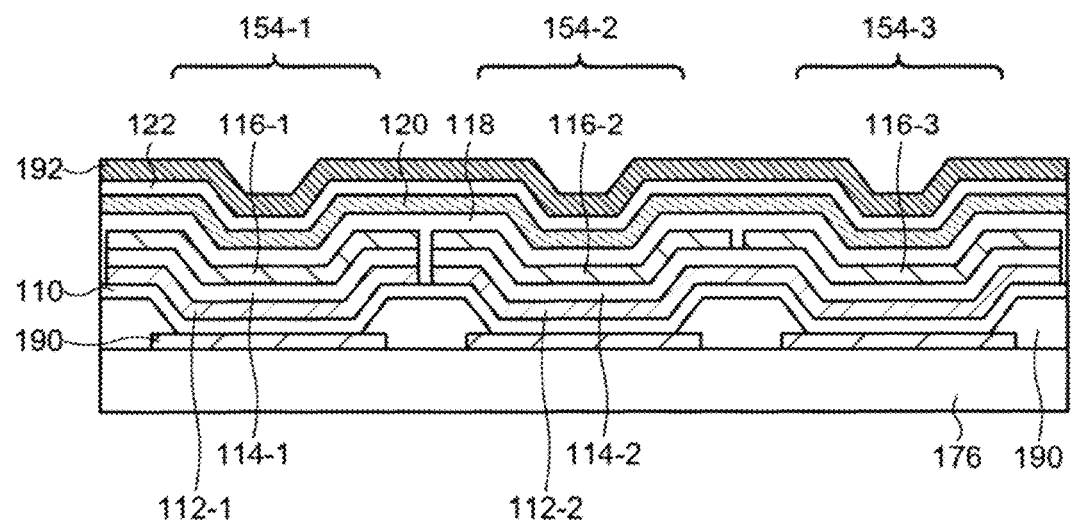
FIGS. 9A and 9B are each a schematic cross-sectional view of a display device according to an embodiment of the present invention.
Figure 9B:
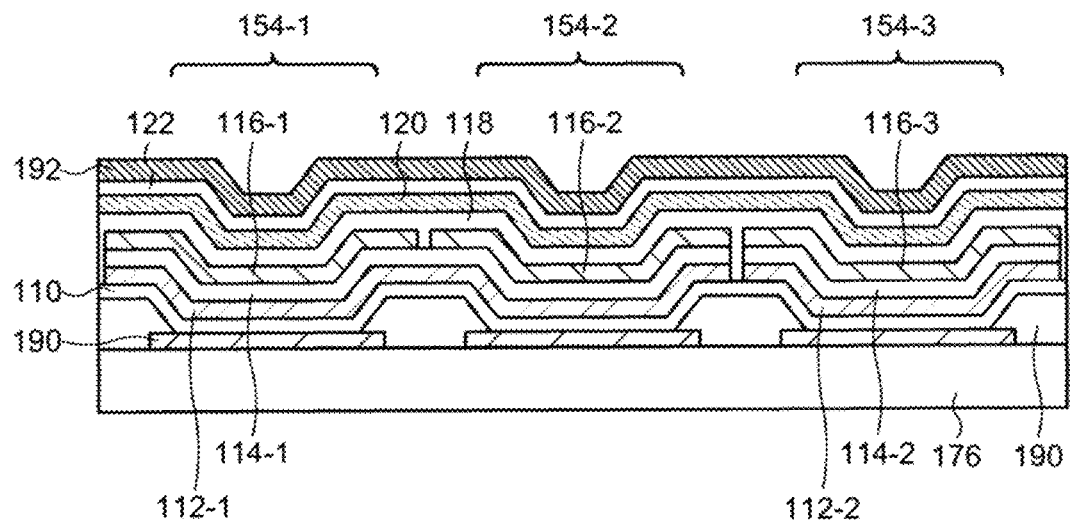

As described above, each of the light-emitting elements arranged in the first pixel 154-1, the second pixel 154-2, and the third pixel 154-3 providing different emission colors may be the light-emitting element 100 described in the First Embodiment. Since the emission color is determined by the emission material, three emission layers (first emission layer 116-1, second emission layer 116-2, and third emission layer 116-3) corresponding to the respective colors are independently disposed in the first pixel 154-1, the second pixel 154-2, and the third pixel 154-3, respectively. Hence, each functional layer other than the emission layer 116 may have the same structure between the pixels 154 and may exist in the same layer in this case (FIG. 9A). Moreover, all of the functional layers may be shared by all of the pixels 154.

3-2. Case where Additional Component is Added to Emission Layer and Functional Layers on Anode Side from Emission Layer (1) Case where Light-Emitting Element 100 is Arranged in Pixel Providing Red Emission As demonstrated in FIG. 9B, the light-emitting element 100 may be disposed in the first pixel 154-1 exhibiting a red emission peak, i.e., an emission peak with the longest wavelength, while light-emitting elements which do not include the additional component in each functional layer may be disposed in other pixels 154 exhibiting emission peaks with a shorter wavelength than that of the first pixel 154. In this case, a phosphorescent material may be included in the emission layer 116 of the light-emitting element 100 of the first pixel 154-1, and the hole-injection layer 110, the hole-blocking layer 118, the electron-transporting layer 120, and the electron-injection layer 122 may be continuously formed along all of the pixels 154 so as to be shared by all of the pixels 154. Thus, these functional layers may exist in the same layer in all of the pixels 154.

On the other hand, when the functional layer in contact with the emission layer 116 is the electron-blocking layer 114, for example, a first electron-blocking layer 114-1 including the additional component is disposed in the first pixel 154-1, while an electron-blocking layer 114-2 which does not include the additional component is disposed in the second pixel 154-2 and the third pixel 154-3. The first electron-blocking layer 114-1 and the electron-blocking layer 114-2 may include the same electron-blocking material as the main component. The electron-blocking layer 114-2 may be shared by the second pixel 154-2 and the third pixel 154-3 and may exist in the same layer in the second pixel 154-2 and the third pixel 154-3.

When the hole-transporting layer 112 of the light-emitting element 100 also includes the additional component, a first hole-transporting layer 112-1 including the additional component is disposed in the first pixel 154-1, while a hole-transporting layer 112-2 which does not include the additional component is disposed in the second pixel 154-2 and the third pixel 154-3. The first hole-transporting layer 112-1 and the hole-transporting layer 112-2 may include the same hole-transporting material as the main component. The hole-transporting layer 112-2 may be shared by the second pixel 154-2 and the third pixel 154-3 and may exist in the same layer in the second pixel 154-2 and the third pixel 154-3. Note that, when no additional component is added to the hole-transporting layer 112 of the light-emitting element 100, the hole-transporting layer 112 having the same structure and existing in the same layer may be formed along all of the pixels 154.

(2) Case where Light-Emitting Elements 100 are Arranged in Pixels Providing Red and Green Emissions The light-emitting elements 100 may be provided in the first pixel 154-1 and the second pixel 154-2 respectively providing red and green emissions, while a light-emitting element including no additional component in the functional layers may be arranged in the third pixel 154-3. In the case where the functional layer in contact with the emission layer 116 is the electron-blocking layer 114, a first electron-blocking layer 114-1 including the additional component is disposed in the first pixel 154-1 and the second pixel 154-2, while an electron-blocking layer 114-2 including no additional component is disposed in the third pixel 154-3. The first electron-blocking layer 114-1 and the electron-blocking layer 114-2 may include the same electron-blocking material as the main component. The first electron-blocking layer 114-1 is shared by the first pixel 154-1 and the second pixel 154-2 and may exist in the same layer in the first pixel 154-1 and the second pixel 154-2.

When the hole-transporting layer 112 of the light-emitting element 100 also includes the additional component, the first hole-transporting layer 112-1 including the additional component is disposed in the first pixel 154-1 and the second pixel 154-2, while the hole-transporting layer 112-2 including no additional component is disposed in the third pixel 154-3. The first hole-transporting layer 112-1 and the hole-transporting layer 112-2 may include the same hole-transporting material as the main component. The first hole-transporting layer 112-1 is shared by the first pixel 154-1 and the second pixel 154-2 and may exist in the same layer in the first pixel 154-1 and the second pixel 154-2. Note that, when the hole-transporting layer 112 of the light-emitting element 100 does not include the additional component, the hole-transporting layer 112 having the same structure and existing in the same layer may be formed along all of the pixels 154.

3-3. Case where Additional Component is Added to Emission Layer and Functional Layers on Cathode Side from Emission Layer (1) Case where Light-Emitting Element 100 is Arranged in Pixel Providing Red Emission As demonstrated in FIG. 10A, the light-emitting element 100 may be disposed in the first pixel 154-1 exhibiting an emission peak with the longest wavelength, while light-emitting elements including no additional component in each functional layer may be disposed in other pixels 154. In this case, the hole-injection layer 110, the hole-transporting layer 112, and the electron-blocking layer 114 may be continuously formed along all of the pixels 154 so as to be shared by all of the pixels 154. Thus, each of these functional layers may exist in the same layer in all of the pixels 154.

On the other hand, when the functional layer in contact with the emission layer 116 is the hole-blocking layer 118, for example, a first hole-blocking layer 118-1 including the additional component is disposed in the first pixel 154-1, while a hole-blocking layer 118-2 including no additional component is disposed in the second pixel 154-2 and the third pixel 154-3. The first hole-blocking layer 118-1 and the hole-blocking layer 118-2 may include the same hole-blocking material as the main component. The hole-blocking layer 118-2 may be shared by the second pixel 154-2 and the third pixel 154-3 and may exist in the same layer in the second pixel 154-2 and the third pixel 154-3.

When the electron-transporting layer 120 of the light-emitting element 100 includes the additional component, a first electron-transporting layer 120-1 including the additional component is disposed in the first pixel 154-1, while an electron-transporting layer 120-2 including no additional component is disposed in the second pixel 154-2 and the third pixel 154-3. The first electron-transporting layer 120-1 and the electron-transporting layer 120-2 may include the same electron-transporting material as the main component. The electron-transporting layer 120-2 may be shared by the second pixel 154-2 and the third pixel 154-3 and may exist in the same layer in the second pixel 154-2 and the third pixel 154-3. Note that, when the electron-transporting layer 120 does not include the additional component, the electron-transporting layer 120 having the same structure and existing in the same layer may be formed along all of the pixels 154.

Figure 10A:
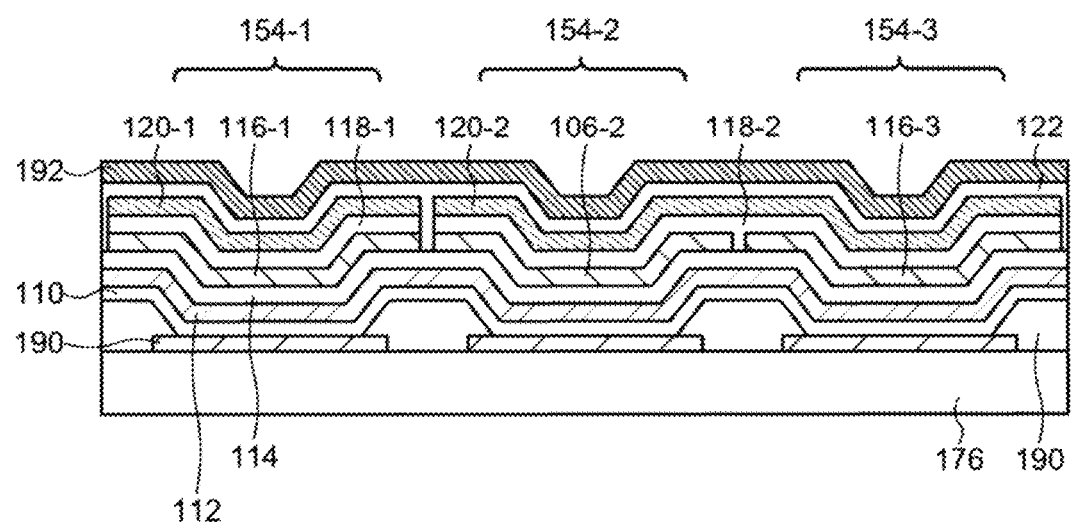
FIGS. 10A and 10B are each a schematic cross-sectional view of a display device according to an embodiment of the present invention.
Figure 10B:
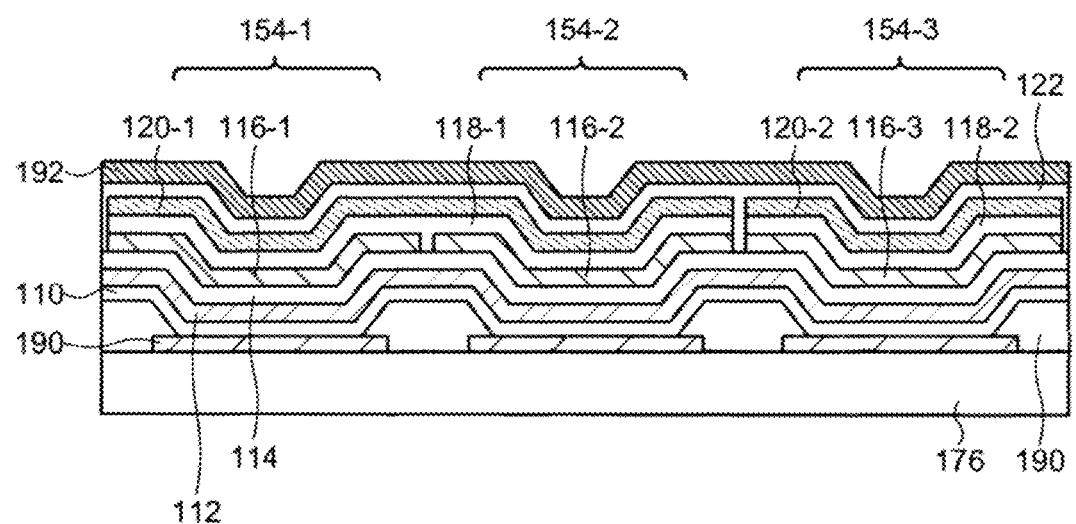

(2) Case where Light-Emitting Elements 100 are Arranged in Pixels Providing Red and Green Emissions As demonstrated in FIG. 10B, the light-emitting elements 100 may be provided in the first pixel 154-1 and the second pixel 154-2 respectively providing red and green emissions, while a light-emitting element including no additional component in the functional layers may be arranged in the third pixel 154-3. In the case where the functional layer in contact with the emission layer 116 is the hole-blocking layer 118, the first hole-blocking layer 118-1 including the additional component is disposed in the first pixel 154-1 and the second pixel 154-2, while the hole-blocking layer 118-2 including no additional component is disposed in the third pixel 154-3. The first hole-blocking layer 118-1 and the hole-blocking layer 180-2 may include the same hole-blocking material as the main component. The first hole-blocking layer 118-1 may be shared by the first pixel 154-1 and the second pixel 154-2 and may exist in the same layer in the first pixel 154-1 and the second pixel 154-2.

When the electron-transporting layer 120 of the light-emitting element 100 includes the additional component, the first electron-transporting layer 120-1 including the additional component is disposed in the first pixel 154-1 and the second pixel 154-2, while the electron-transporting layer 120-2 including no additional component is disposed in the third pixel 154-3. The first electron-transporting layer 120-1 and the electron-transporting layer 120-2 may include the same electron-transporting material as the main component. The first electron-transporting layer 120-1 may be shared by the first pixel 154-2 and the second pixel 154-2 and may exist in the same layer in the first pixel 154-1 and the second pixel 154-2. Note that, when the electron-transporting layer 120 of the light-emitting element 100 does not include the additional component, the electron-transporting layer 120 having the same structure and existing in the same layer may be formed along all of the pixels 154.

As described in the First Embodiment, although the additional component increases the threshold voltage of the light-emitting element 100, it does not lead to an increase in a driving voltage in a practical luminance region. Therefore, a current leak, especially, a current leak from a pixel providing an emission with a short wavelength can be prevented, and a decrease in display quality due to cross talk caused by the current leak does not occur. Hence, it is possible to prevent an increase in power consumption and produce a display device capable of performing high-quality display by implementing the light-emitting element 100 according to an embodiment of the present invention.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A light-emitting element comprising:
an anode;
a first functional layer over the anode, the first functional layer including a first hole-transporting material and a hole-trapping material;
a second functional layer located between the anode and the first functional layer, in contact with the first functional layer, and including a second hole-transporting material and the hole-trapping material;
an emission layer over and in contact with the first functional layer, the emission layer including a host material, an emission material, and the hole-trapping material;
an electron-transporting layer over the emission layer; and
a cathode over the electron-transporting layer,
wherein concentrations of the hole-trapping material are lower than concentrations of the first hole-transporting material and the host material in the first functional layer and the emission layer, respectively,
a highest occupied molecular orbital level of the hole-trapping material is higher than a highest occupied molecular orbital level of the first hole-transporting material and a highest occupied molecular orbital level of the host material,
a concentration of the hole-trapping material is lower than that of the second hole-transporting layer in the second functional layer, and
a highest occupied molecular orbital of the second hole-transporting material is higher than the highest occupied molecular orbital of the hole-trapping material.

2. The light-emitting element according to claim 1, wherein a difference between the highest occupied molecular orbital level of the hole-trapping material and the highest occupied molecular orbital level of the first hole-transporting material is equal to or more than 0.2 eV.

3. The light-emitting element according to claim 1, wherein a lowest unoccupied molecular orbital level of the first hole-transporting material is higher than a lowest unoccupied molecular orbital level of the host material by 0.2 eV or more.

4. The light-emitting element according to claim 1, wherein the concentrations of the hole-trapping material are each equal to or more than 5 vol % and equal to or less than 30 vol % in the first functional layer and the emission layer.

5. The light-emitting element according to claim 1, wherein the concentrations of the hole-trapping material are the same as each other in the first functional layer and the emission layer.

6. The light-emitting element according to claim 1, wherein the concentration of the hole-trapping material in the emission layer is lower than the concentration of the hole-trapping material in the first functional layer.

7. The light-emitting element according to claim 1, wherein a thickness of the first functional layer is equal to or more than 1 nm and equal to or less than 5 nm.

8. A display device comprising:
a first pixel including a first light-emitting element; and
a second pixel including a second light-emitting element,
wherein the first light-emitting element comprises:
a first anode;
a first functional layer over the first anode, the first functional layer including a first hole-transporting material and a hole-trapping material;
a second functional layer located between the first anode and the first functional layer, in contact with the first functional layer, and including a second hole-transporting material and the hole-trapping material;
a first emission layer over and in contact with the first functional layer, the emission layer including a first host material, a first emission material, and the hole-trapping material;
an electron-transporting layer over the first emission layer; and
a cathode over the electron-transporting layer,
the second light-emitting element comprises:
a second anode;
a hole-transporting layer over the second anode, the hole-transporting layer including the first hole-transporting material;
a second emission layer over the hole-transporting layer, the second emission layer including a second host material and a second emission material;
the electron-transporting layer over the second emission layer; and
the cathode over the electron-transporting layer,
wherein concentrations of the hole-trapping material are lower than concentrations of the first hole-transporting material and the first host material in the first functional layer and the first emission layer, respectively, a highest occupied molecular orbital level of the hole-trapping material is higher than a highest occupied molecular orbital level of the first hole-transporting material and a highest occupied molecular orbital level of the first host material, a concentration of the hole-trapping material is lower than that of the second hole- transporting layer in the second functional layer, and a highest occupied molecular orbital of the second hole-transporting material is higher than the highest occupied molecular orbital of the hole-trapping material.

9. The display device according to claim 8,
wherein a difference between the highest occupied molecular orbital level of the hole-trapping material and the highest occupied molecular orbital level of the first hole-transporting material is equal to or more than 0.2 eV.

10. The display device according to claim 8,
wherein a lowest unoccupied molecular orbital level of the first hole-transporting material is higher than a lowest unoccupied molecular orbital level of the first host material by 0.2 eV or more.

11. The display device according to claim 8,
wherein the concentrations of the hole-trapping material are each equal to or more than 5 vol % and equal to or less than 30 vol % in the first functional layer and the first emission layer.

12. The display device according to claim 8,
wherein the concentrations of the hole-trapping material are the same as each other in the first functional layer and the first emission layer.

13. The display device according to claim 8,
wherein the concentration of the hole-trapping material in the first emission layer is lower than the concentration of the hole-trapping material in the first functional layer.

14. The display device according to claim 8,
wherein a thickness of the first functional layer is equal to or more than 1 nm and equal to or less than 5 nm.

15. The display device according to claim 8,
wherein an emission peak wavelength of the first emission material is longer than an emission peak wavelength of the second emission material.

16. The display device according to claim 8,
wherein the first emission material is a phosphorescent material.

* * * * *